United States Patent
Bureau et al.

(10) Patent No.: US 6,729,001 B2
(45) Date of Patent: *May 4, 2004

(54) METHOD FOR MAKING A SONOPROBE

(75) Inventors: Jean-Marc Bureau, Valbonne (FR); François Bernard, Les Ulis (FR)

(73) Assignee: Thomson-CSF, Paris (FR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/341,112

(22) PCT Filed: Nov. 5, 1998

(86) PCT No.: PCT/FR98/02372

§ 371 (c)(1),
(2), (4) Date: Jul. 7, 1999

(87) PCT Pub. No.: WO99/24175

PCT Pub. Date: May 20, 1999

(65) Prior Publication Data

US 2002/0129477 A1 Sep. 19, 2002

(30) Foreign Application Priority Data

Nov. 7, 1997 (FR) ............................................. 97 14049

(51) Int. Cl.⁷ ........................ H04R 17/10; H05K 3/10; B32B 31/00
(52) U.S. Cl. ........................ 29/25.35; 29/594; 29/852; 29/DIG. 1; 29/846; 310/311; 310/313 R; 156/253
(58) Field of Search ..................... 29/594, 25.35, 29/852, DIG. 1, 846, 831; 156/253, 327; 216/17, 18; 310/311, 313 R, 345

(56) References Cited

U.S. PATENT DOCUMENTS

| 4,388,136 A | * | 6/1983 | Huie et al. ............... 156/253 X |
| 4,768,130 A | | 8/1988 | Bernard et al. |
| 4,840,923 A | * | 6/1989 | Flagello et al. ............... 216/18 |
| 4,855,022 A | | 8/1989 | Poupard et al. |
| 5,091,893 A | * | 2/1992 | Smith et al. ............... 29/25.35 |
| 5,235,463 A | | 8/1993 | Broussoux et al. |
| 5,262,351 A | | 11/1993 | Bureau et al. |
| 5,308,443 A | * | 5/1994 | Sugihara ..................... 29/852 |
| 5,418,365 A | | 5/1995 | Robin et al. |
| 5,437,195 A | | 8/1995 | Bureau et al. |
| 5,617,865 A | * | 4/1997 | Palczewska et al. ........ 29/25.35 |
| 5,618,737 A | | 4/1997 | Robin et al. |
| 5,655,276 A | * | 8/1997 | Pattanayak et al. ........ 29/25.35 |

(List continued on next page.)

FOREIGN PATENT DOCUMENTS

| EP | 0025092 | * | 3/1981 | |
| FR | 2702309 | * | 9/1994 | |
| JP | 63-6885 | * | 1/1988 | ............... 29/25.35 |

OTHER PUBLICATIONS

Termination of Flexible Printed Circuits to Rigid Printed Ciruits, IBM Technical Disclosure Bulletin, vol. 28, NR 12, pp. 5621–5622, May 1986.*

(List continued on next page.)

Primary Examiner—A. Dexter Tugbang
(74) Attorney, Agent, or Firm—Oblon, Spivak, McClelland, Maier & Neustadt, P.C.

(57) ABSTRACT

A process for the fabrication of a multielement acoustic probe. A flexible circuit having conducting tracks on at least one of its sides is used. This circuit is joined to a plate of piezoelectric material having metallizations. Vias are produced through the flexible circuit in order to address the metallizations and to produce electrical contacts within the vias. This process may be used in echography probes.

6 Claims, 17 Drawing Sheets

U.S. PATENT DOCUMENTS

| | | | |
|---|---|---|---|
| 5,774,960 A | | 7/1998 | De Fraguier et al. |
| 5,785,787 A | * | 7/1998 | Wojnarowski et al. ...... 156/327 |
| 5,908,304 A | | 6/1999 | Oudart et al. |
| 6,044,533 A | | 4/2000 | Bureau et al. |
| 6,341,408 B2 | | 1/2002 | Bureau et al. |

OTHER PUBLICATIONS

Esashi et al, Fabrication of Semiconductor Tactile Imager, Electronics and Communications in Japan, Part 2, vol. 23, No. 11, pp. 31–37, Jan. 1990.*

Smith et al, Update on 2–D Array Transducers for Medical Ultrasound, IEEE Ultrasonics Symposium 1995, pp. 1273–1278, Jul. 1995.*

Chiang et al, Microfilled Via: An Enabling Technology for High Density H Performance High Volume BGA Substrates, Electronics Manuacturing Technology Symposium Nineteenth IEEE/CPMT, pp. 66–69, Oct. 1996.*

McNulty et al, Michrowave Multichip Modules Using Low Cost Microwave Flex Packaging Technology, 1998 International Conference on MultiChip Modules and High Density Packaging, 19 Proceedings; pp. 262–267, Apr. 1998.*

* cited by examiner

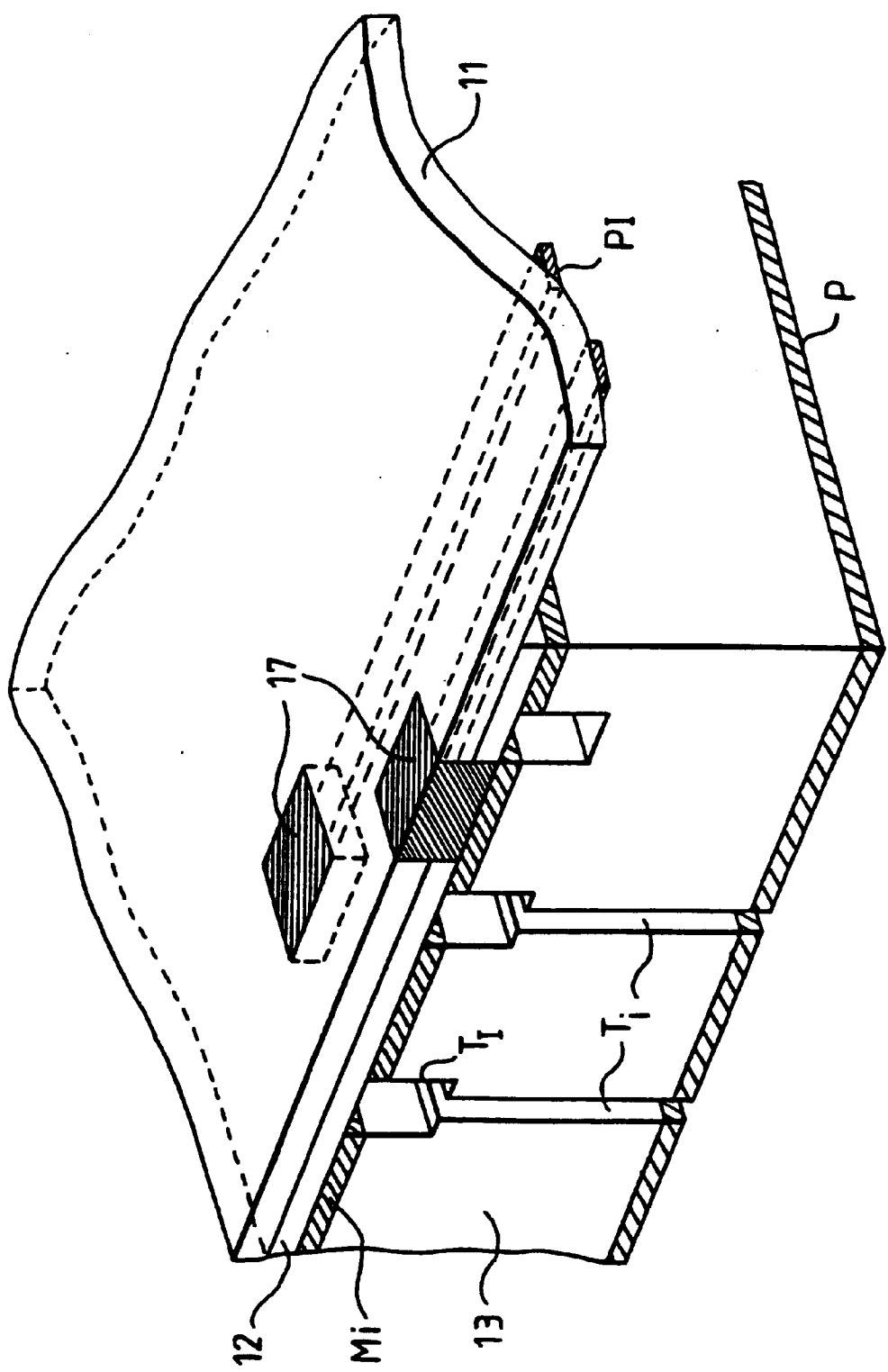

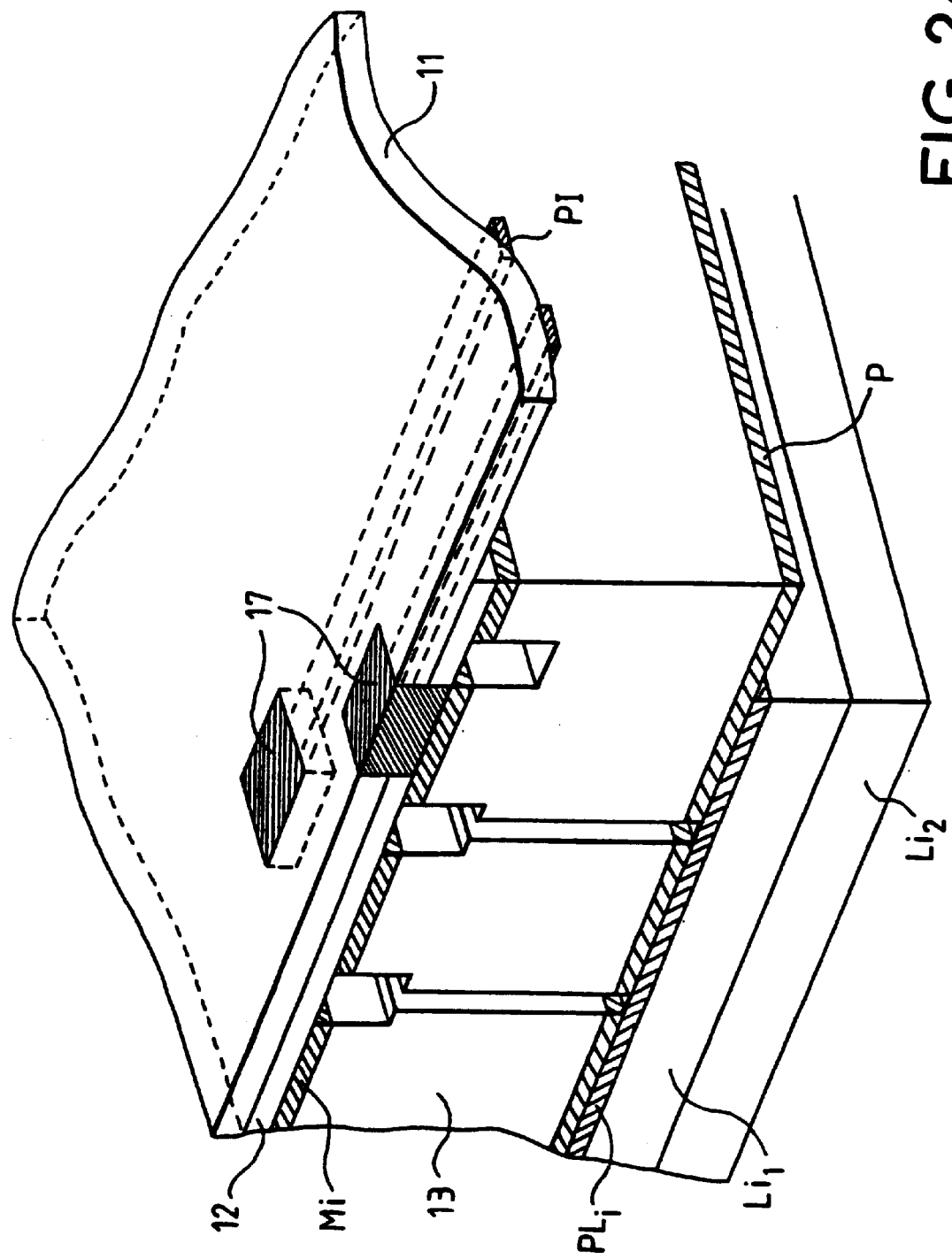

SECTION ON BB

SECTION ON CC

SECTION ON DD

METHOD FOR MAKING A SONOPROBE

BACKGROUND OF THE INVENTION

1. Field of the Invention

The present invention relates to processes for the fabrication of acoustic probes comprising a set of emitting and/or receiving elements obtained by cutting from a large-sized transducer block. Such probes are especially used at the present time in applications such as echography.

2. Discussion of the Background

The invention relates more particularly to the means allowing the electrical connections to be made between the transducer elements and the electronic devices which are connected thereto. It makes it easier to fabricate transducers having a large number of elements arranged in particular in a two-dimensional arrangement.

Among the known connection techniques for two-dimensional echography probes is a process described by the Applicant in the French patent application published under No. 2,702,309, which proposes the use of a thin polymer film laminated to a metallized piezoelectric ceramic.

According to this prior art, vias are then collectively machined in the film at the position of the individual transducers to be interconnected. The connections are then made by lines etched in a metal layer deposited on the film and in the vias.

These lines are produced within the ceramic and on its periphery, and a flat connection means is therefore used on the surface of the ceramic, extended by a flexible connection means which can be bent over the edges of the ceramic in order to minimize the space taken up.

Such a process makes it possible to produce an acoustically discrete connection means which is able to conform to geometries that are sometimes complex (probes that are curved and of small size). Nevertheless, the step of producing the fine tracks with a fine spacing is carried out on an end-of-process product, and therefore one having a high added value, and having critical track-etching regions at the transition between flexible parts (flex) and rigid parts (ceramic).

SUMMARY OF THE INVENTION

In order to alleviate these drawbacks, the invention proposes a connection technique using a circuit of the dielectric-film type on which the interconnection lines are produced before assembly on the active elements of the probe. As will be explained later, this circuit may advantageously comprise interconnection lines on both sides.

More specifically, the subject of the invention is a process for the fabrication of an acoustic probe comprising an interconnection circuit and individual transducers produced in a plate of piezoelectric material which includes metallizations relating to the individual transducers, characterized in that it comprises the following steps:

production of conducting tracks on at least one side of a dielectric film (11, 21, 31);

bonding of the said dielectric film having conducting tracks to a layer (13, 23, 33) of piezoelectric material which includes metallizations, using a layer of dielectric adhesive (12, 22, 32);

production of vias through the dielectric film (11, 21, 31) and the layer of dielectric adhesive (12, 22, 32) by means of a suitable localization process so as to produce, simultaneously, vias which emerge, on the one hand, on a conducting track and, on the other hand, on an associated metallization;

production of electrical contacts between a conducting track (PI, PI$_1$, PI$_2$) and the metallization of the associated piezoelectric material (mi).

According to a first embodiment of the invention, the suitable localization process may be the focusing of an ablation laser.

According to a second embodiment of the invention, the suitable localization process may comprise the use of a mask.

According to one embodiment of the invention, the conducting tracks are produced on the lower side of the dielectric film, the layer of adhesive being in contact with this lower side and the layer of piezoelectric material. According to this embodiment, a metal mask may advantageously be produced, on the surface of the dielectric film, for the next step of etching the vias.

It is also possible to use an independent mechanical mask.

In general, the electrical contact between a conducting track and the metallization of the associated piezoelectric material is obtained by localized deposition of a conductive material, which may be a metal layer etched by masking or a conductive resin.

According to one embodiment, the electrical contact between a conducting track and the metallization of the associated piezoelectric material may be obtained by successive depositions of a metallization layer and of a layer of masking resin, followed by etching in order to leave the metallization layer only within the vias.

According to another embodiment of the invention, the upper side of the dielectric film comprises metal tracks. In this case, the etching may advantageously be carried out through a mechanical mask after having covered the upper side comprising the conducting tracts with a resin. After the vias have been etched, the step of producing the electrical contact between a conducting track and the metallization of the associated piezoelectric material may be carried out be depositing a layer of metal, followed by etching in order to leave the conducting layer only at the bottom of the vias, as will be explained below.

In general, the electrical contacts may be connected up by filling in the vias with a conductive resin, rather than by depositing a metallization layer and then by etching this layer.

BRIEF DESCRIPTION OF THE DRAWINGS

The invention will be more clearly understood and further advantages will appear on reading the description which follows, given by way of non-limitation, and by means of the appended figures among which:

FIGS. 2a to 2f illustrate various steps of one example of the fabrication process according to the invention, using the flexible circuit illustrated in FIG. 1;

DETAILED DESCRIPTION OF THE PREFERRED EMBODIMENTS

In general, the process according to the invention firstly comprises the production of conducting tracks on a dielectric film which will form the interconnection circuit. Advantageously, this may be a flexible film made of a polymer of the polyimide-film type.

Figure 1:
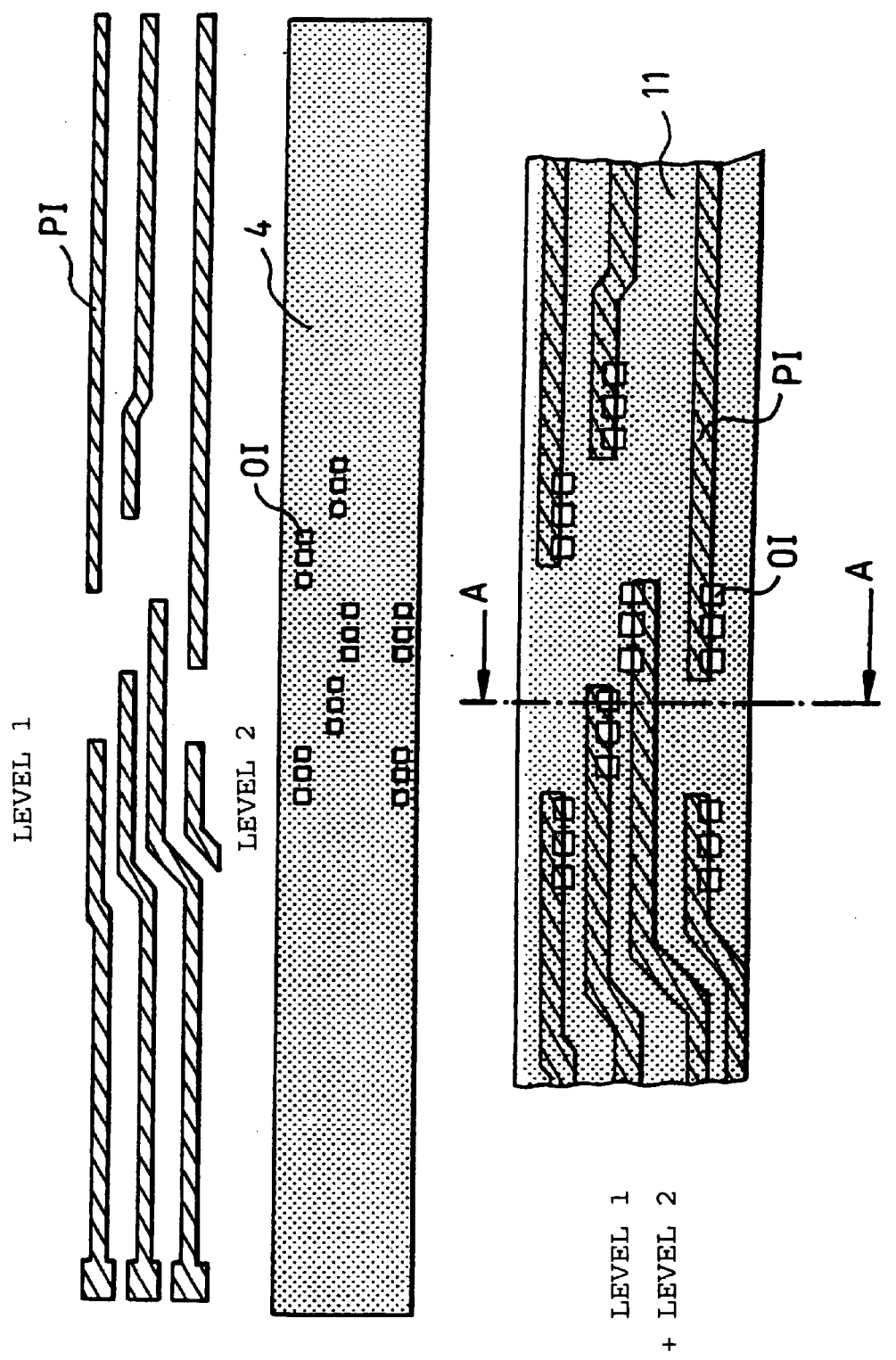
FIG. 1 illustrates a first example of a flexible circuit comprising conducting tracks on the lower side, used in an acoustic probe according to the invention.

According to a first example of the process, the flexible circuit 11 comprises, on one side, called the lower side, interconnection tracks PI (for example made of gold-plated copper) corresponding to level 1 in FIG. 1a and, on one side, called the upper side, a metal plane (for example made of copper) 14 in which apertures are produced, these apertures being intended subsequently for the selective machining of the dielectric film and corresponding to level 2 in FIG. 1. The superposition of levels 1 and 2 in FIG. 1a shows that, intentionally, several apertures OI superposed on the same conducting track PI are defined. This affords greater reliability in connecting up the electrical contacts and also allows the acoustic impedances to be adjusted depending on the number of vias which might be produced in the dielectric film of which the flexible circuit is composed.

Figure 2A:
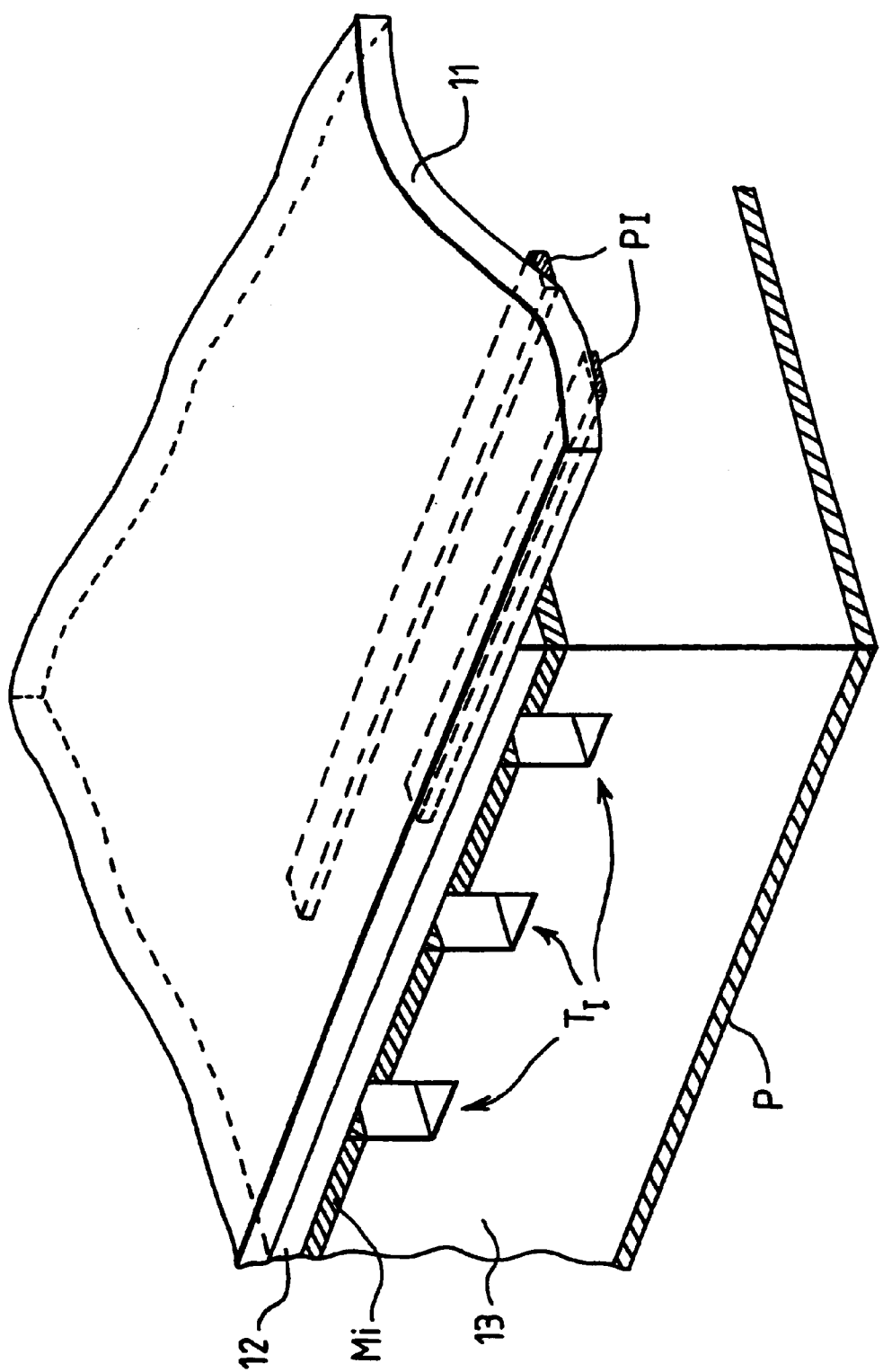

The flexible circuit 11 having conducting tracks PI is laminated to a metallized layer of piezoelectric material 13. Typically, this is a metallized PZT piezoelectric plate in which saw cuts $T_r$ have been made beforehand, which saw cuts allow the metallizations Mi to be isolated and which will subsequently allow the piezoelectric elements to be separated. FIG. 2a shows, for this purpose, the flexible circuit placed on top of the piezoelectric plate. For the sake of clarity, the metal plane is not shown in FIG. 2a in order to reveal the conducting tracks PI.

Figure 2B:
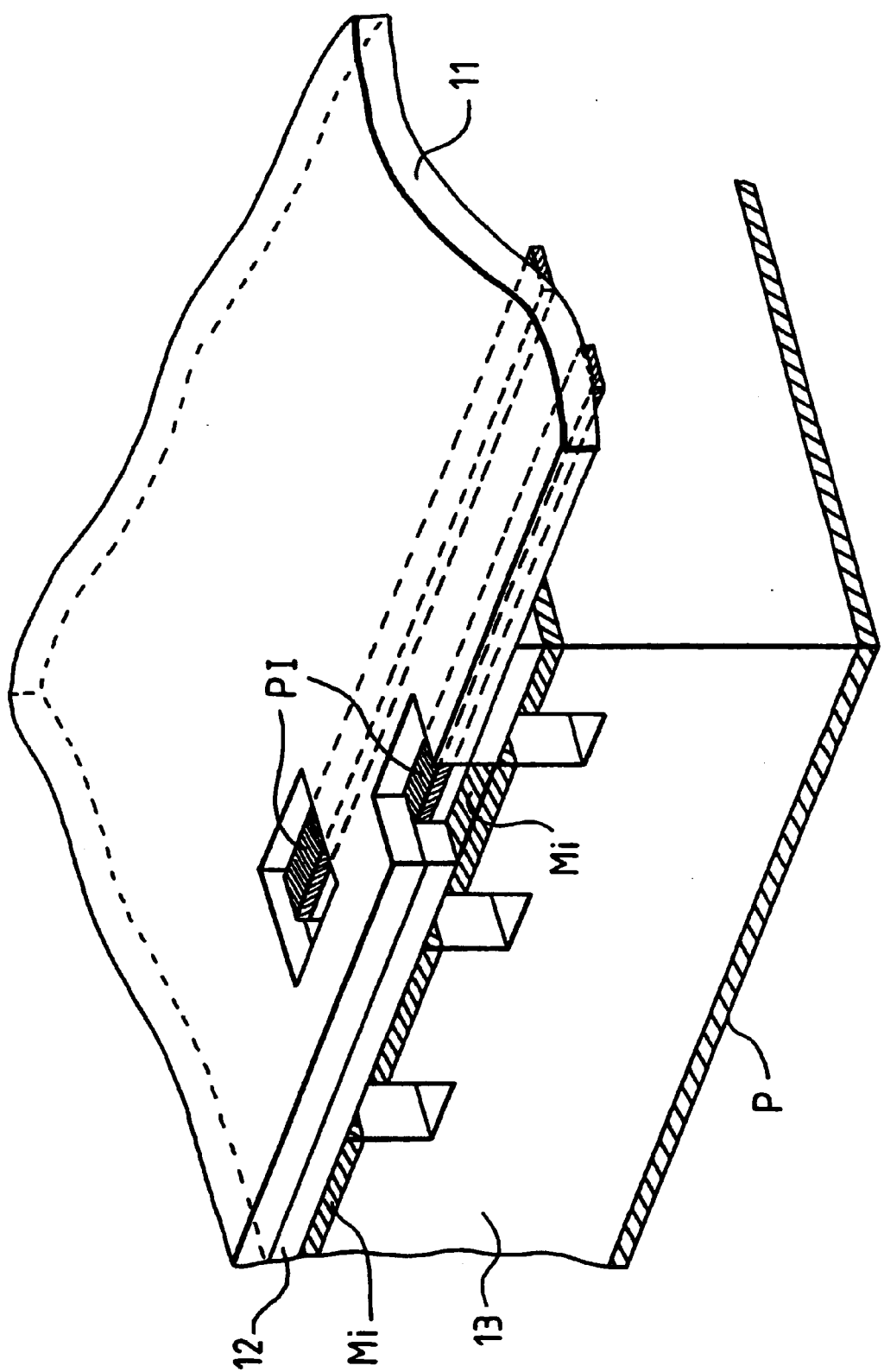

Next, the vias are machined in the dielectric film, above each piezoelectric element to be connected. The machining is carried out through the mask, present on the flexible circuit, by laser ablation or by reactive ion etching, thus part of the conducting track and the metallization of the transducer to be connected are exposed at the bottom of each via, as illustrated in FIG. 2b.

It should be noted that it is also possible to use a mechanical mask positioned on the assembly, as a replacement for the metal masking plane.

When the vias have been produced, the step of connecting up the electrical contacts in the vias is then carried out.

This step may be carried out in several ways, and especially according to the two versions described below.

Figure 3A:
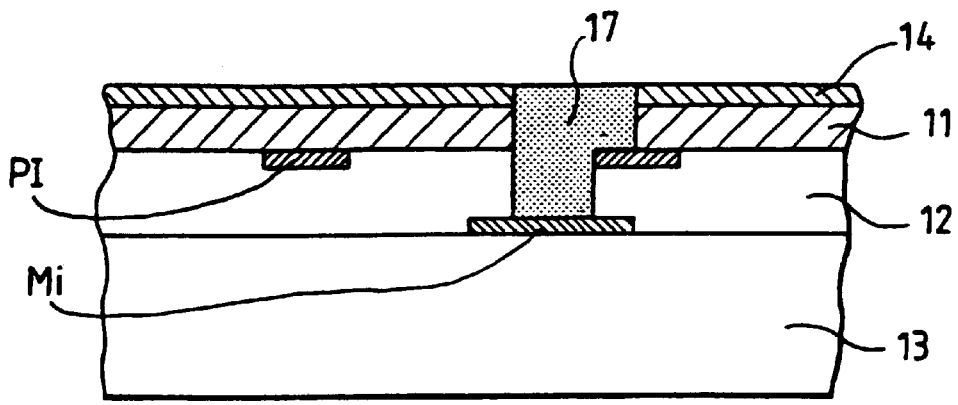
FIGS. 3a and 3b illustrate a first example of connecting up an electrical contact in the vias, used in the process according to the invention.

According to a first second version, the contacts are connected up directly by using a thermosetting conductive resin. The dielectric film 11 and the metallization of the piezoelectric element form a reservoir above the points to be connected. The deposit of conductive resin 17 may therefore be automatically positioned simply by scraping the surface of the probe (see FIG. 3a, corresponding to a cross-sectional view on the direction AA in FIG. 1).

Figure 3B:
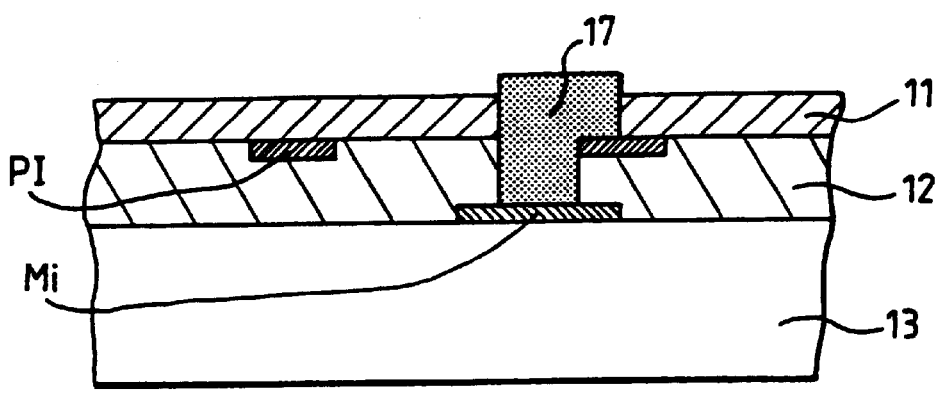

Next, selectively etching the metal of the layer 14 allows the connection pads to be isolated, while removing any traces of thermosetting conductive resin on the surface (FIG. 3b).

Figure 4A:
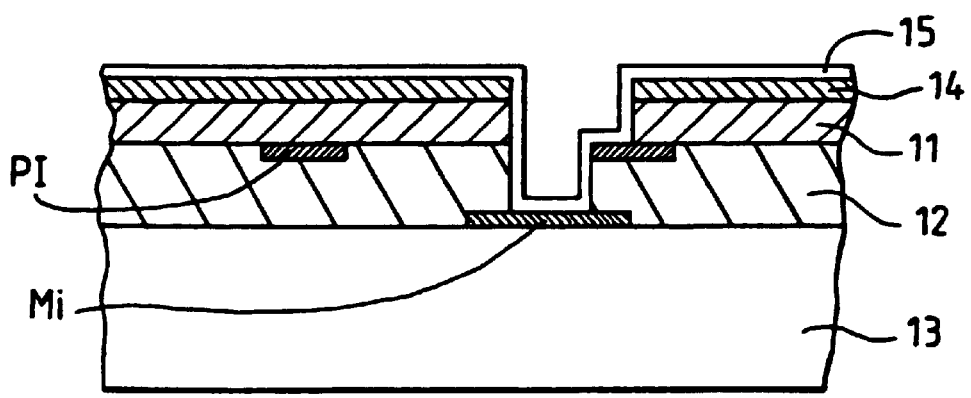
FIGS. 4a to 4d illustrate a second example of connecting up an electrical contact in the vias, used in the process according to the invention.
Figure 4B:
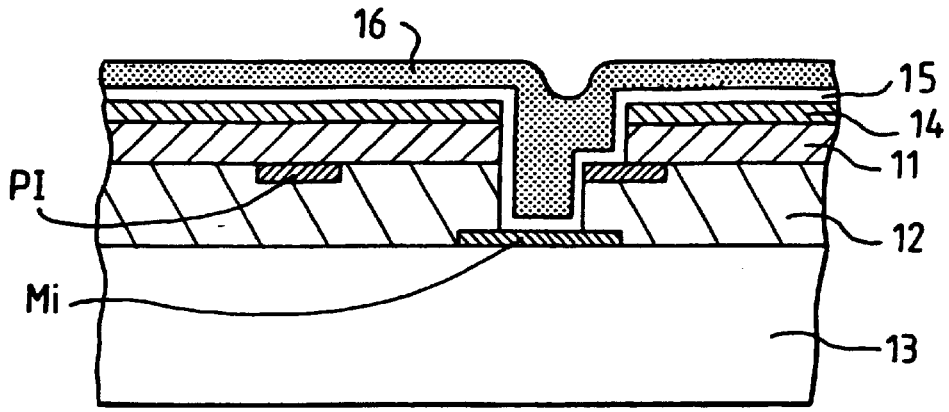

According to a second version, the contacts are connected up by collective metallization using a metal layer 15 (FIG. 4a). The metal deposited at the bottom of the vias makes the electrical connection between the conducting track and the metallization present at the bottom of the via. A masking resin 16 is then deposited, which makes it possible, by a process of photolithography, to define a resin mask in order to selectively etch the metal layer 15 and thus to isolate each via (FIG. 4b).

Figure 4C:
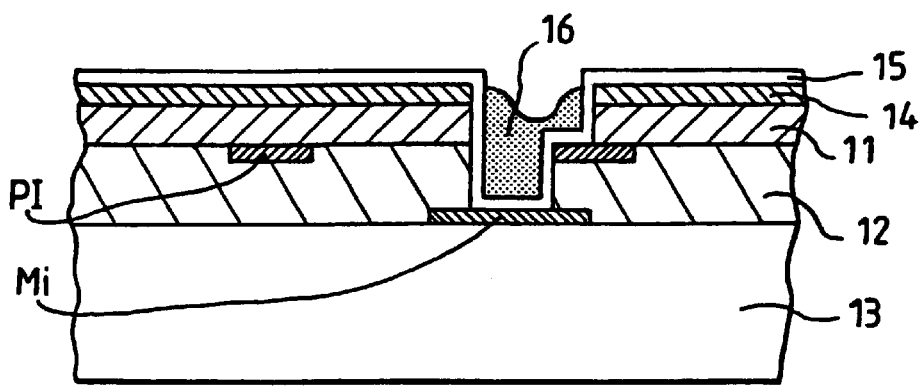

It is then possible, using photolithography, to remove the surface while still leaving a protective layer at the bottom of each via (FIG. 4c).

Figure 4D:
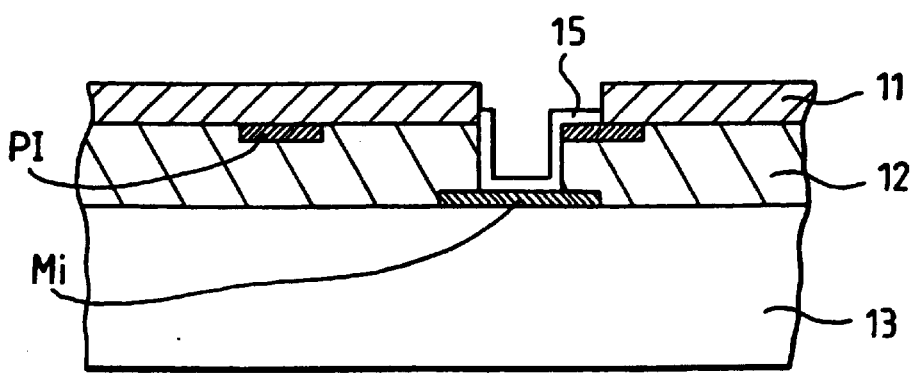

The metal layer 15 may then be etched, as illustrated in FIG. 4d, so as to obtain the electrical contact between a conducting track and a metallization of the associated piezoelectric element.

Figure 2C:
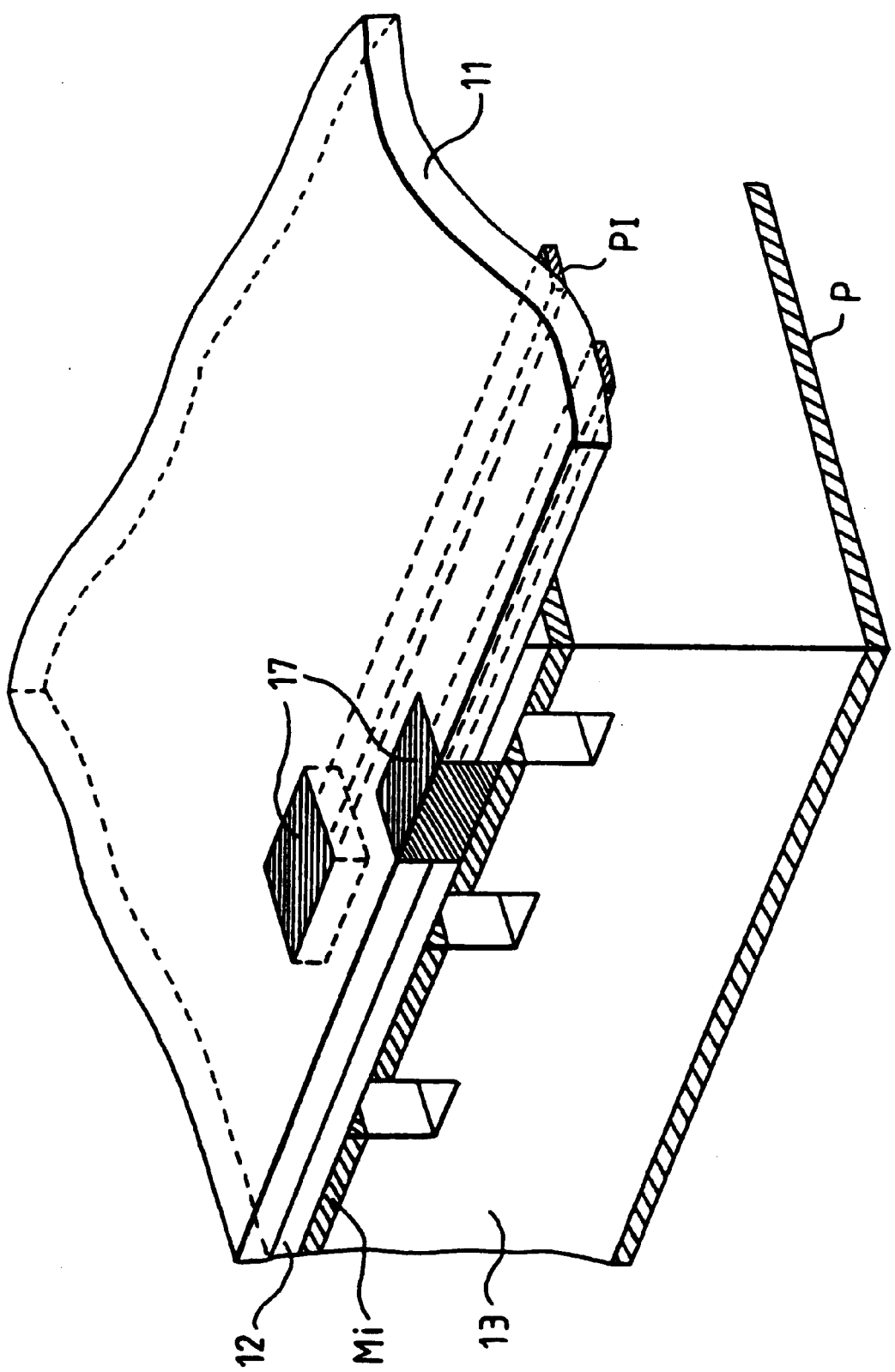

FIG. 2c illustrates a configuration in which the electrical contact is provided by pads of conductive resin 17.

In order to separate the transducer elements, saw cuts Ti may advantageously be made in the directions parallel to the direction AA shown in FIG. 1 (see FIG. 2d).

Two acoustic matching plates $Li_1$ and $Li_2$ are then joined to the cut piezoelectric plate 13. The upper plate $Li_1$ has a metallized surface Pli so as to reform a continuous earth plane (FIG. 2e).

Figure 2F:
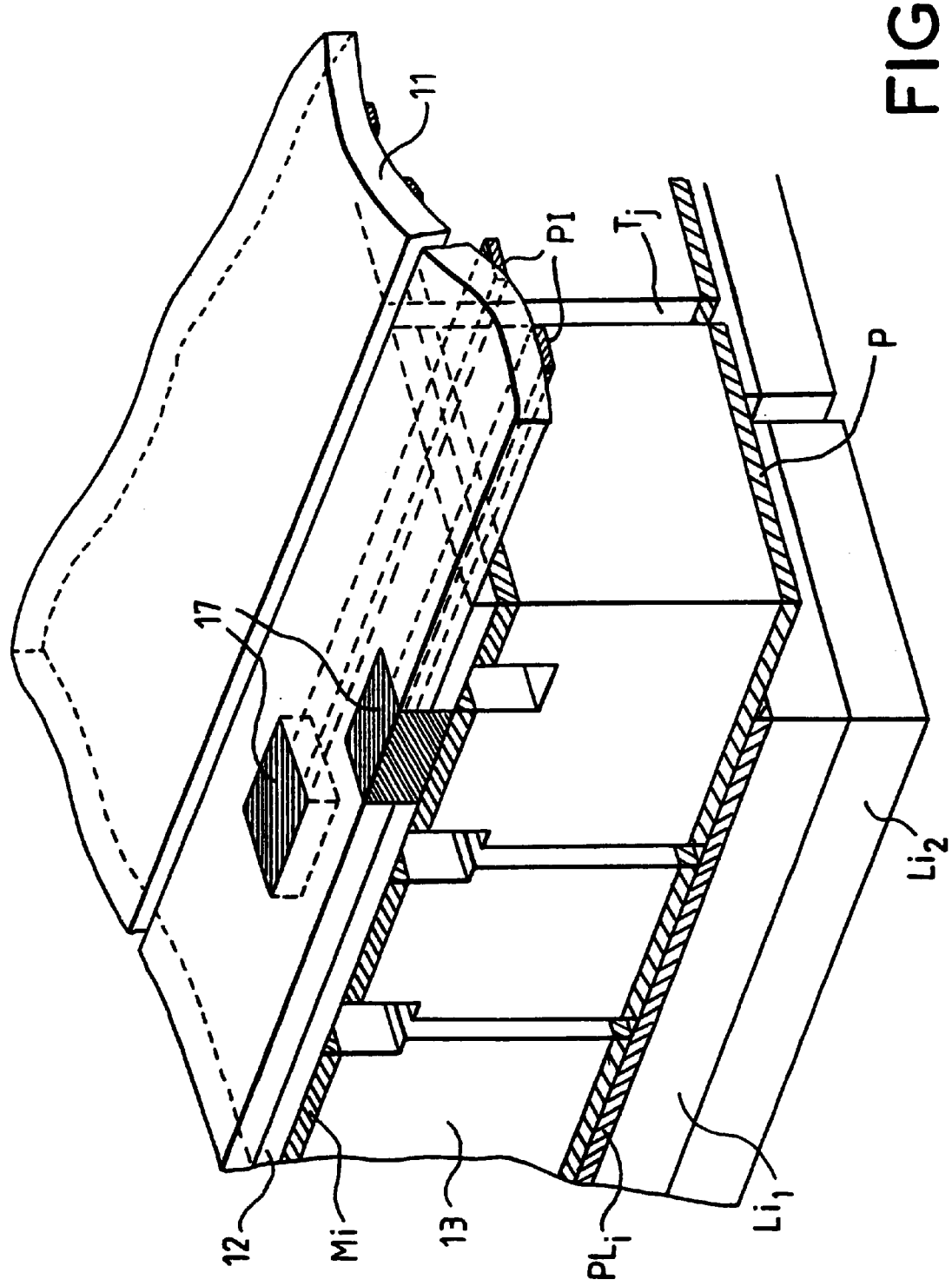

Finally, saw cuts Tj are made in directions perpendicular to the cuts Ti (FIG. 2f).

Figure 5:
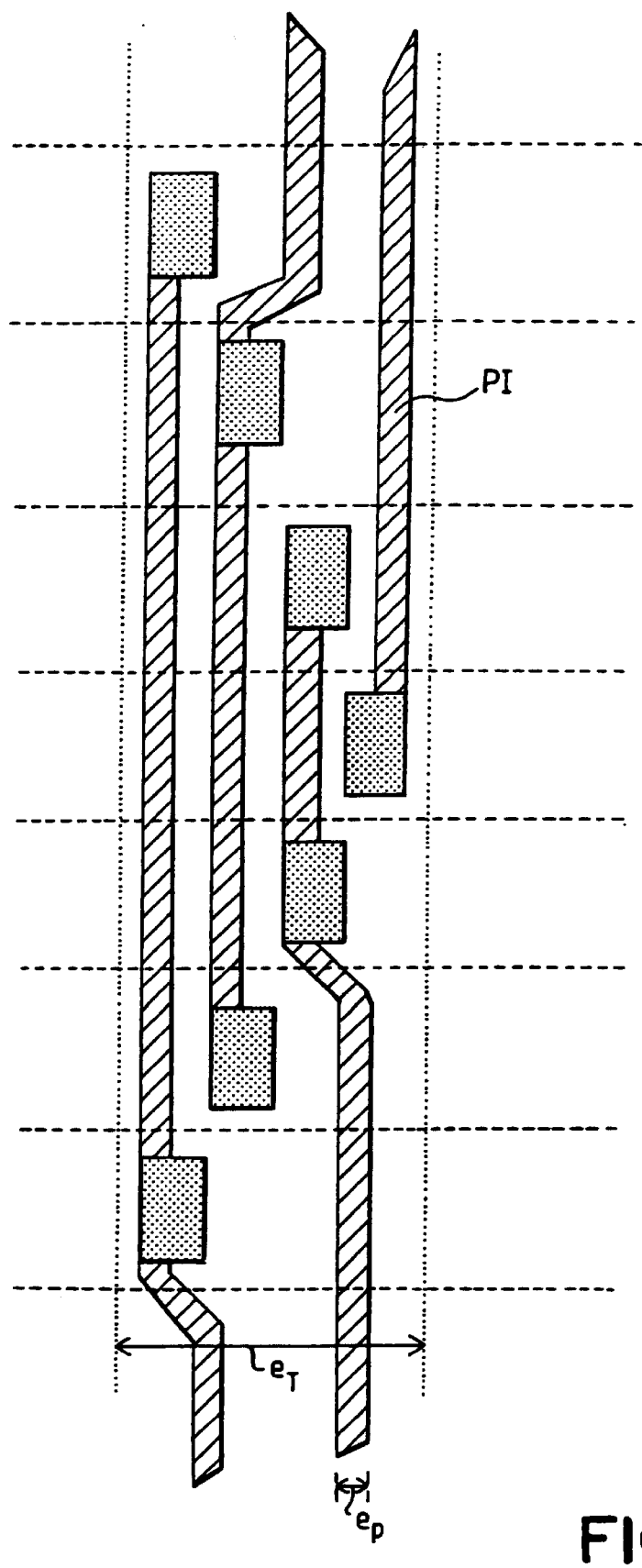
FIG. 5 illustrates a construction in which 7 strips of piezoelectric elements are interconnected on 4 pathways.

Thus, a matrix of piezoelectric elements is thus obtained, these piezoelectric elements being addressable by means of the so-called hot-spot outputs (tracks PI) and of the plane plane P output. By way of example, FIG. 5 illustrates a construction in which 7 symmetrical strips are interconnected on 4 pathways. Typically, the piezoelectric elements are portrayed by the dotted lines. Typically, this configuration makes it possible to define piezoelectric elements having a width $e_t$ of about 480 $\mu$m and a track width $e_p$ of about 50 $\mu$m.

According to a second example of the process, the flexible circuit includes conducting tracks on the upper side (level 2) and an earth plane P, on the opposite side, on the so-called lower side (level 1).

Figure 6:
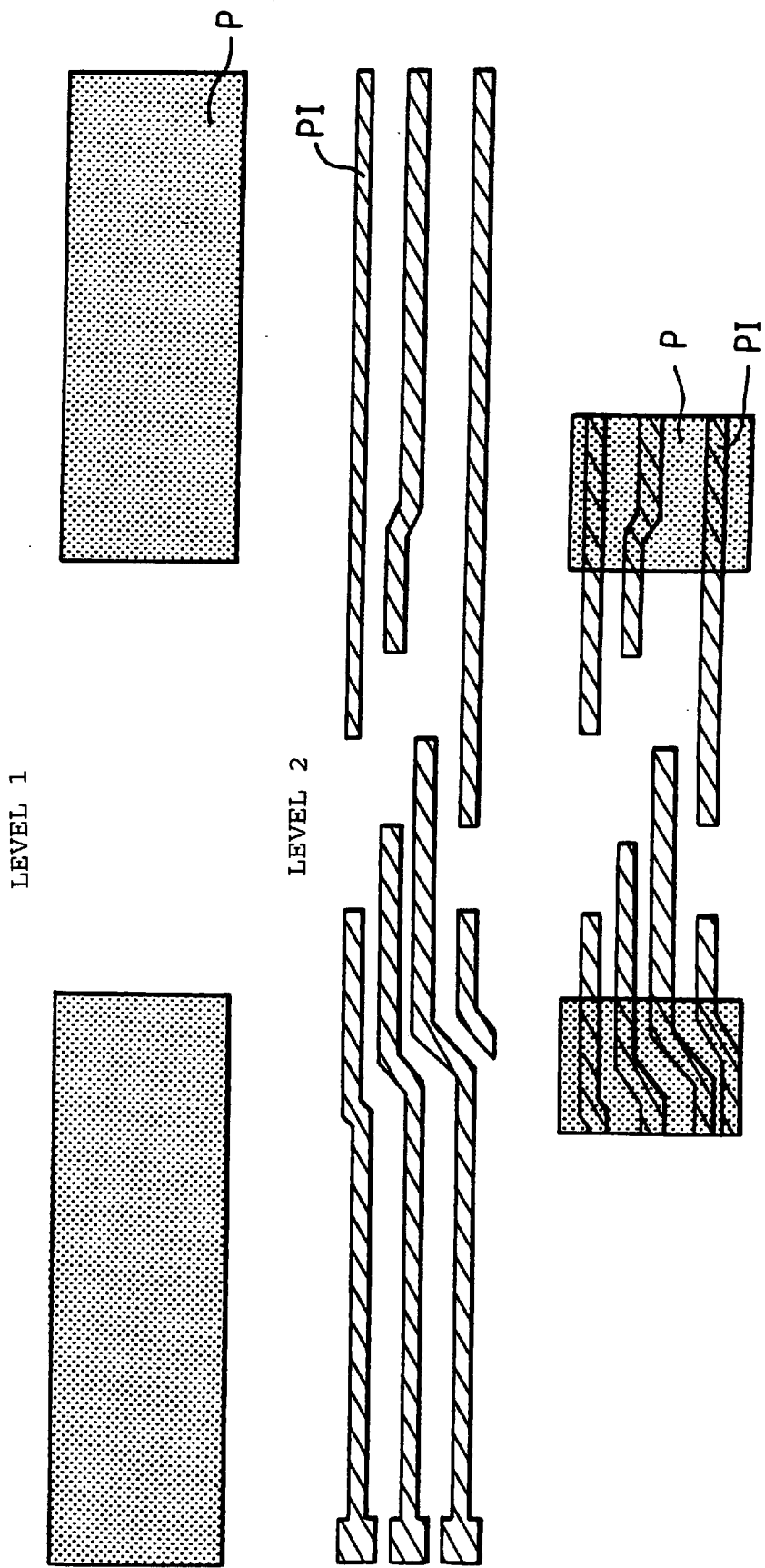
FIG. 6 illustrates a second example of a flexible circuit comprising conducting tracks on the upper side, used in an acoustic probe according to the invention.

In this configuration, the dielectric film 21 includes, on its upper side, the conducting tracks PI and, on its lower side, the earth plane P together with the aperture provided at the position of the transducer elements, as illustrated in FIG. 6.

Figure 7A:
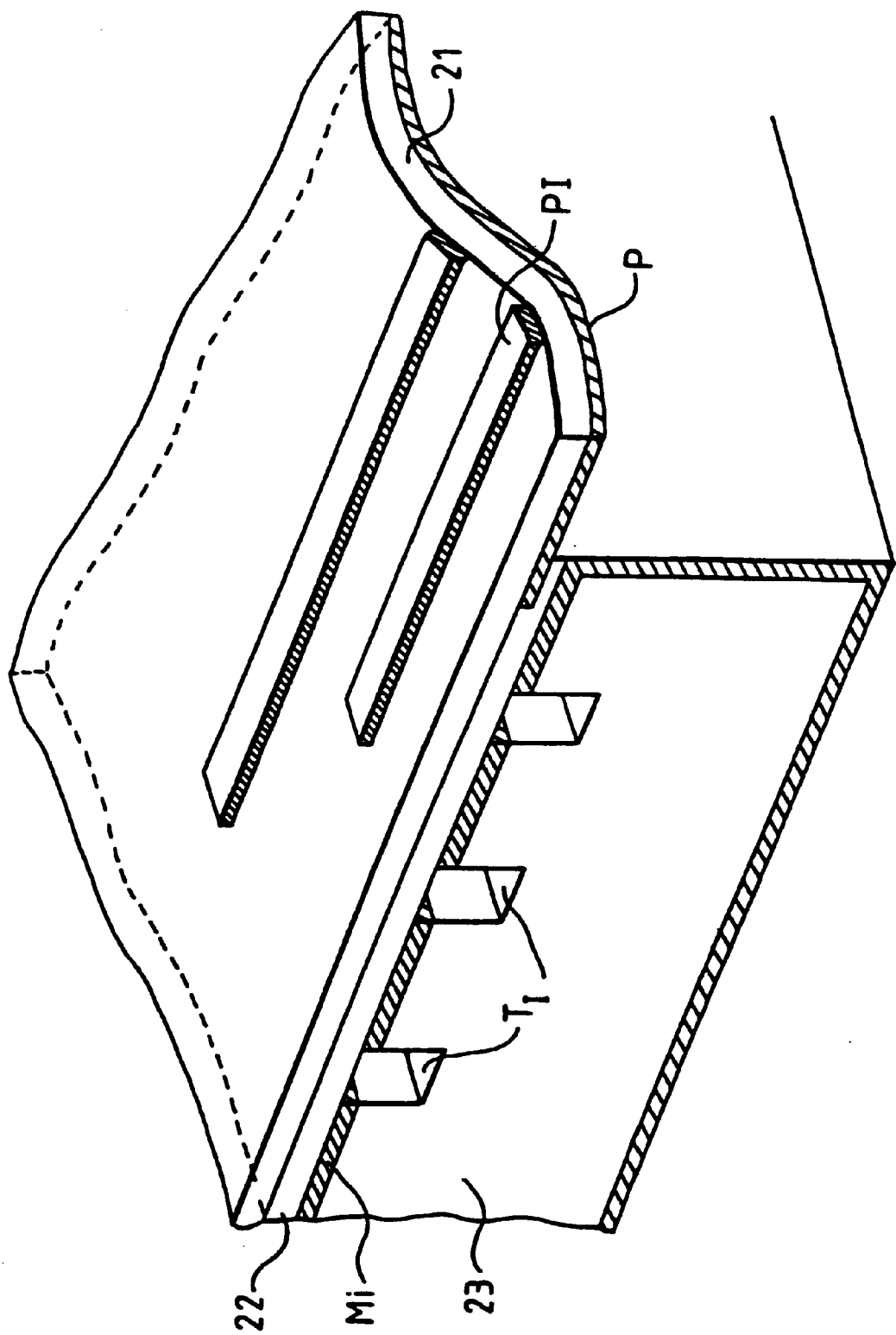
FIGS. 7a to 7d illustrate various steps of an example of a fabrication process according to the invention, using the flexible circuit illustrated in FIG. 6.
Figure 7B:
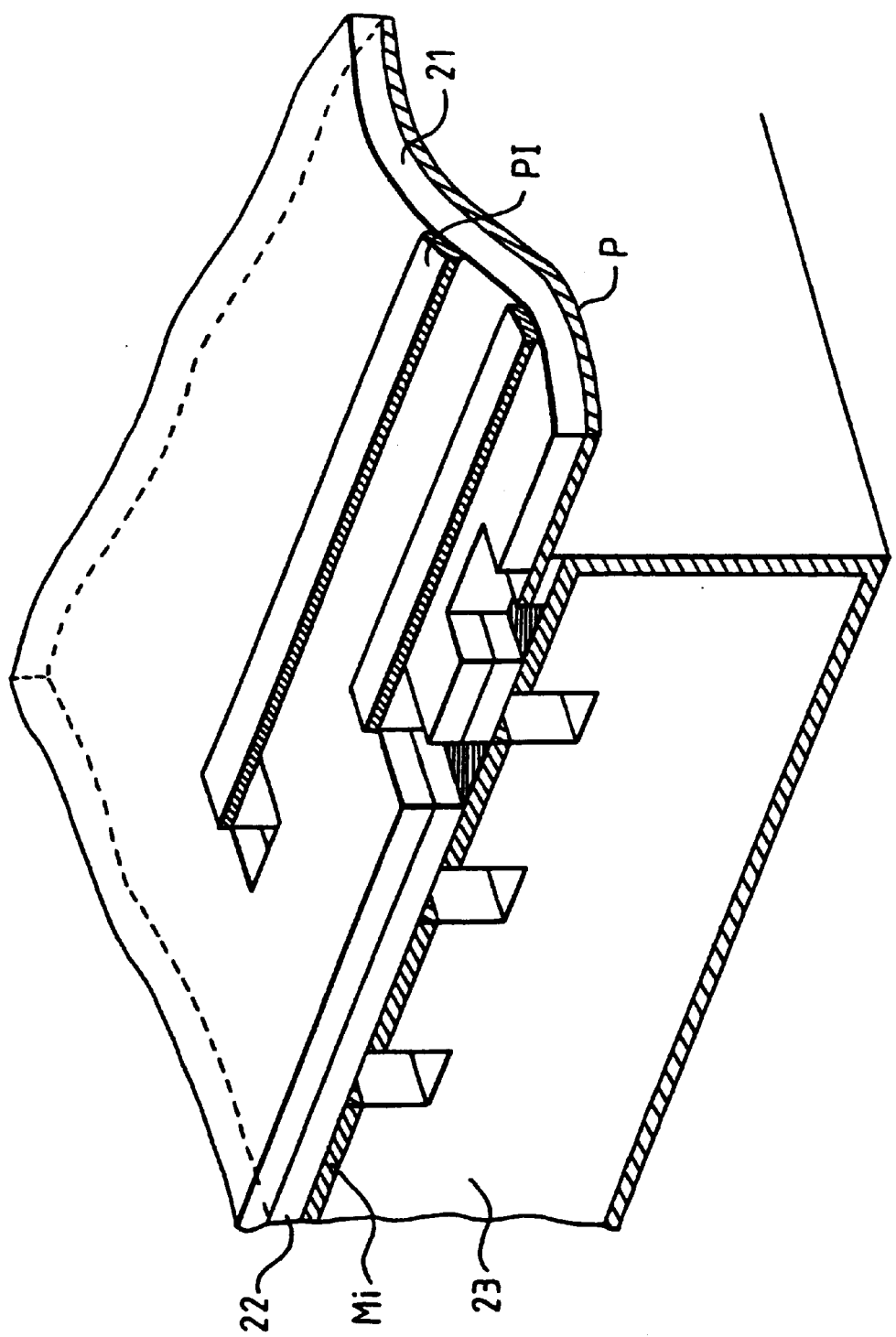

Secondly, the dielectric film 21 is laminated to the layer of piezoelectric material 23 having cuts $T_f$ by means of a layer of dielectric adhesive 22 (FIG. 7a). Next, a layer of resin is laminated on top of the dielectric film 21 and its conducting tracks PI. The vias are then machined by laser ablation through a mechanical mask 24 (FIG. 7b).

Figure 7C:
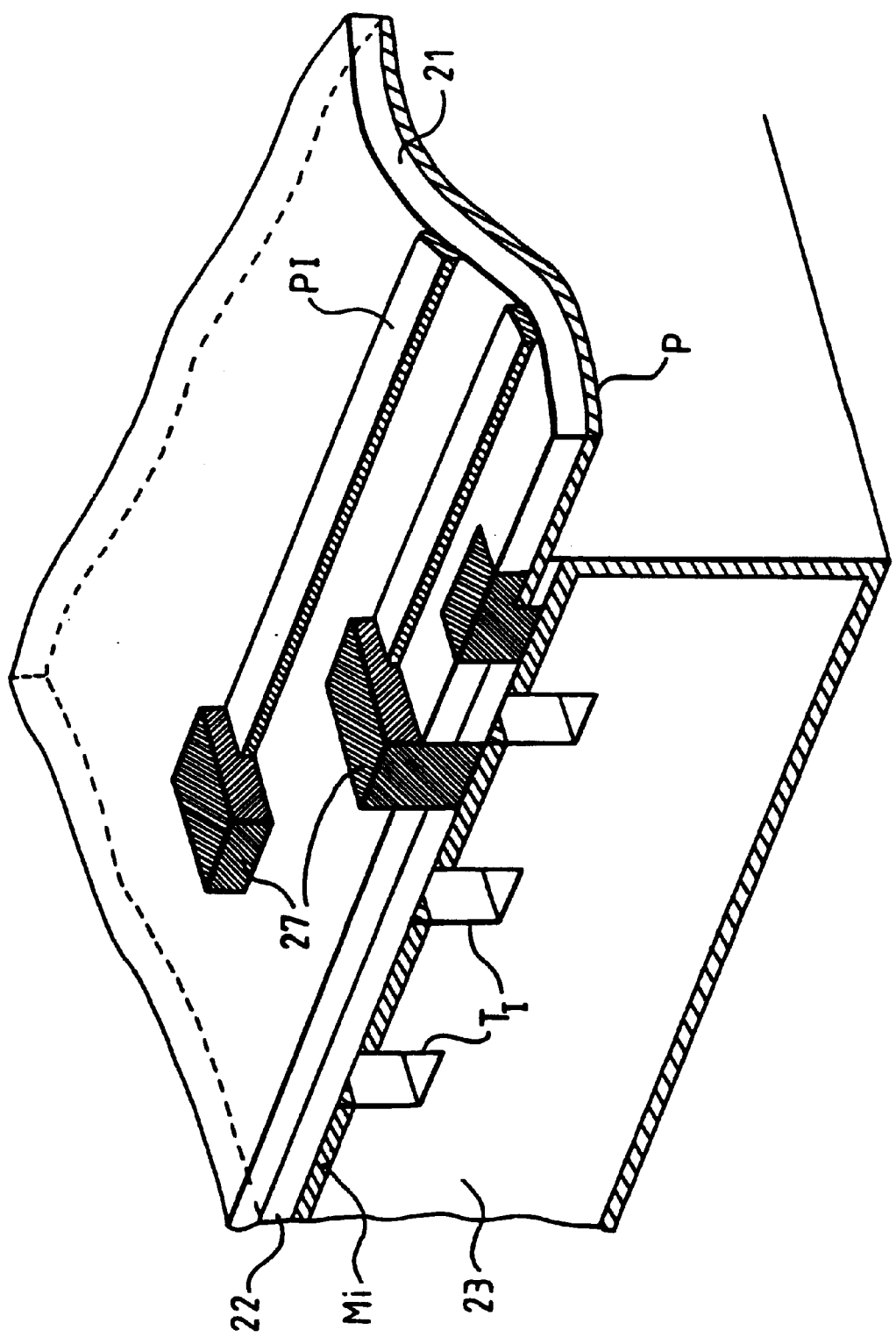

As in the first example of the process mentioned above, the contact may be connected up by collective metallization or by the use of a conductive resin, as illustrated in FIG. 7c.

In the case of collective metallization, a layer of metal is deposited on the etched layer of resin 26 and on the vias. Thus, the metal deposited on the bottom of the vias makes the electrical connection between the line and the metallization of the associated piezoelectric element. Selective etching of the metal present on the surface, through a resin mask, allows each via to be isolated.

According to another version, the contacts may be connected up by filling in the vias using a thermosetting conductive resin 27. The deposit of conductive resin may thus be automatically positioned simply by scraping the surface of the probe.

Figure 7D:
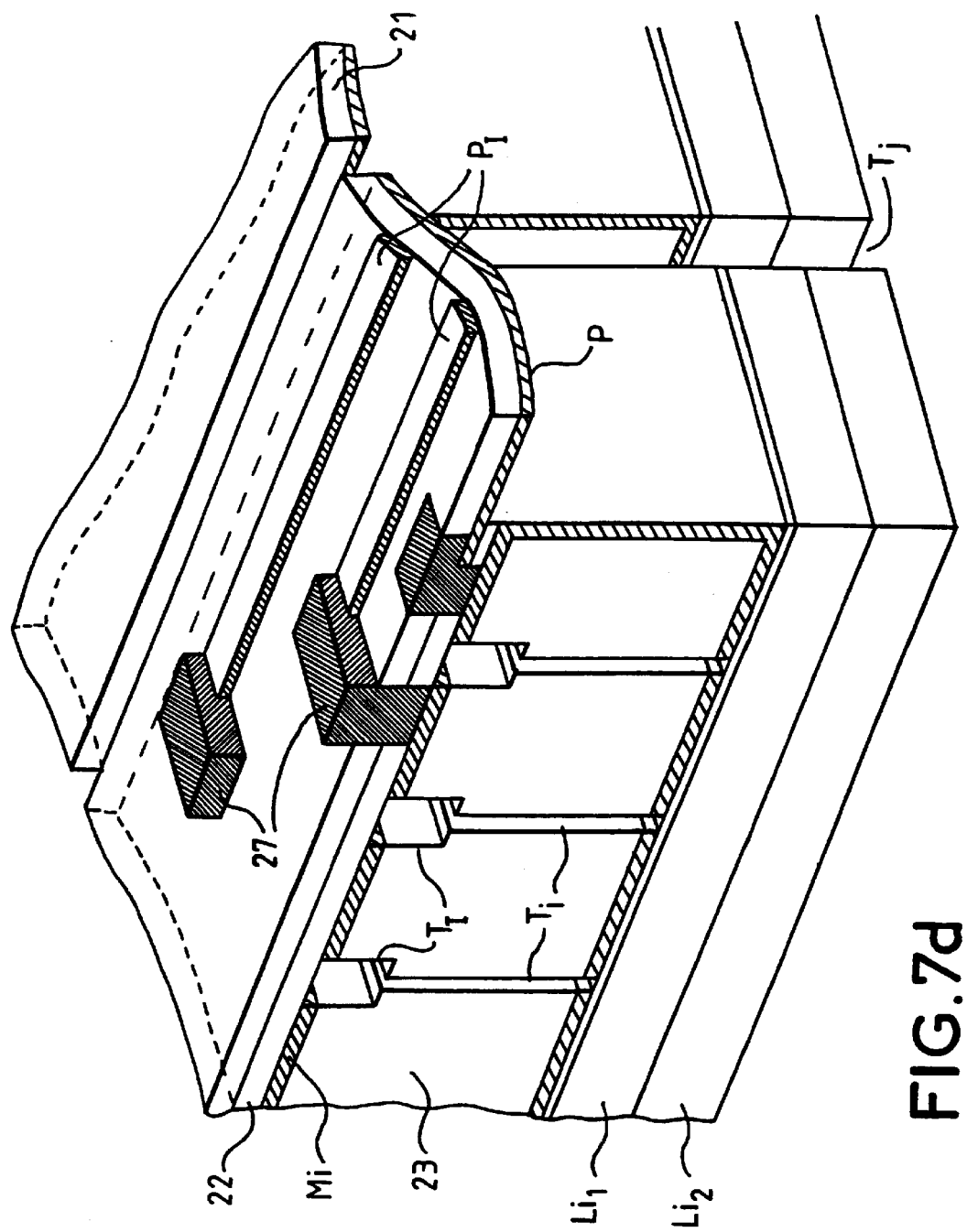

It is also possible to connect up the contacts by the screen-printing of "straddling" pads of conductive resin on the conducting tracks and on the vias, thus making it possible to be free of the lamination of the resin layer. As in the previous example, the acoustic matching plate $Li_1$ and $Li_2$ are joined and then the elements are cut by saw cuts Ti and TJ (FIG. 7d). The transducer elements are thus addressed by means of the so-called hot-spot outputs (tracks PI) and of the earth plane P output.

According to a third example of the process, a flexible circuit is produced with conducting tracks on level 1 and on level 2 corresponding to the upper and lower surfaces of the dielectric film, respectively. Advantageously, level 2 may also include an earth plane P2. The steps of the process for producing the vias and for connecting up the contact may be similar to those described in the second example of the process. The advantage of this configuration of the flexible circuit resides in the increase in the density of interconnects on the transducers using a second level of connection means. By way of example, FIGS. 8a to 8d illustrate a construction in which 5 symmetrical strips may be connected on 3 pathways. The conducting tracks of the upper level 1 are labelled $PI_1$ and the conducting tracks of the lower level are labelled $PI_2$. Typically, this configuration makes it possible to define piezoelectric elements with a width $e_T$ of about 250 μm with a via width $e_v$ of about 130 82 m and a track width $e_p$ of about 50 μm.

Figure 8A:
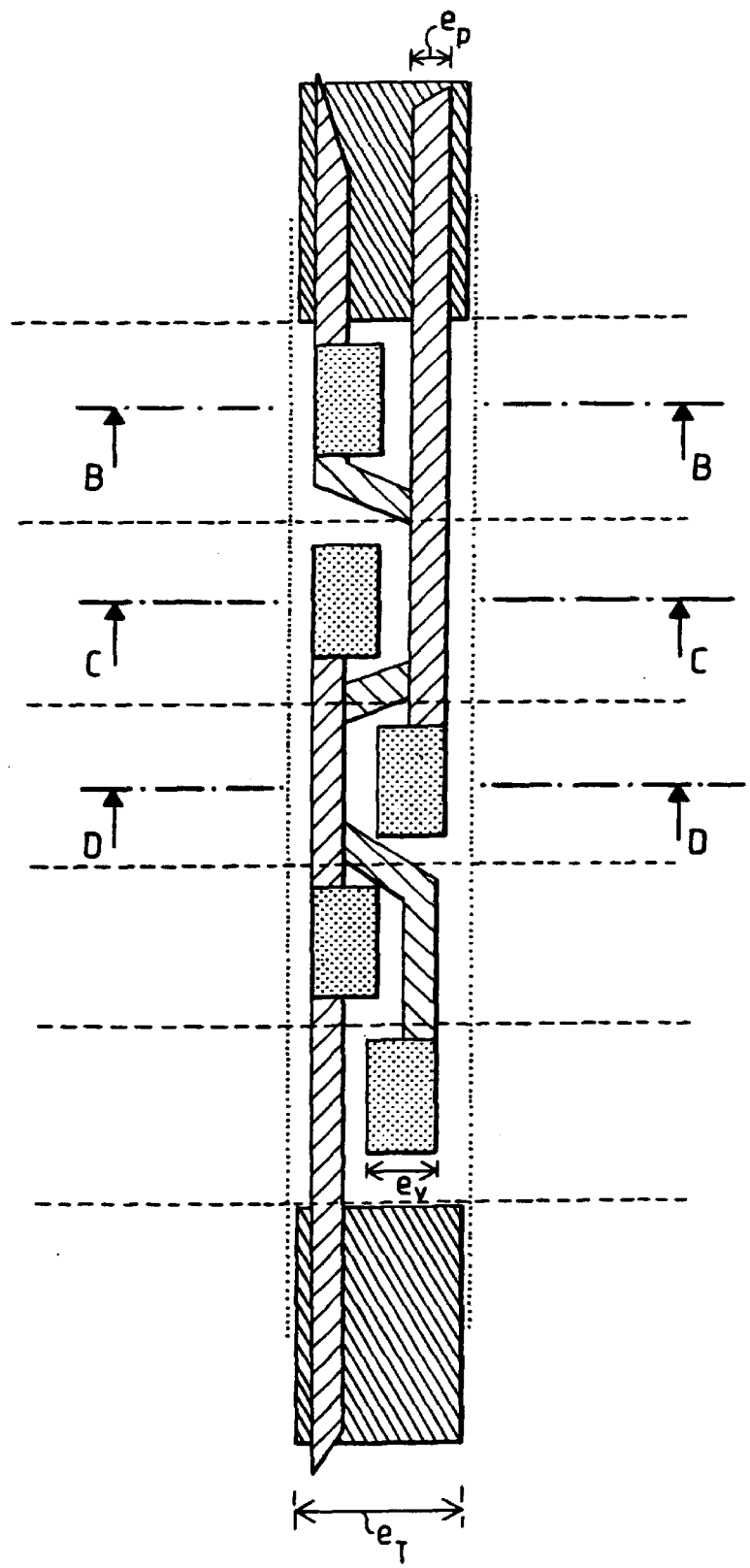
FIGS. 8a to 8d illustrate a construction in which 5 strips of piezoelectric elements are interconnected on 3 pathways.
Figure 8B:
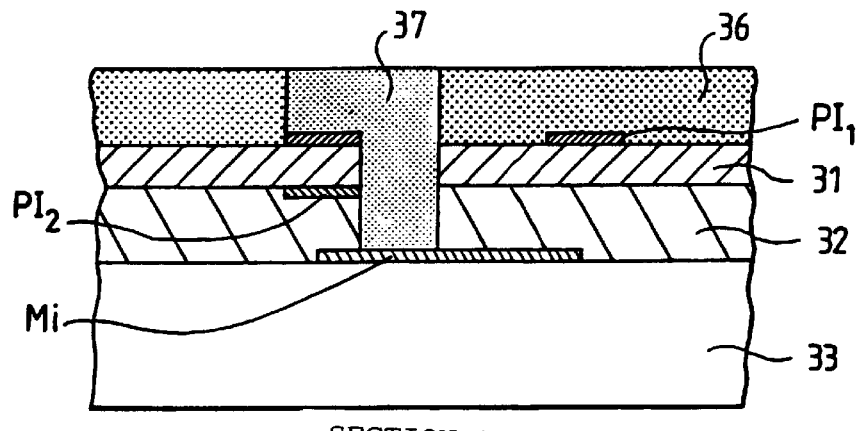
Figure 8C:
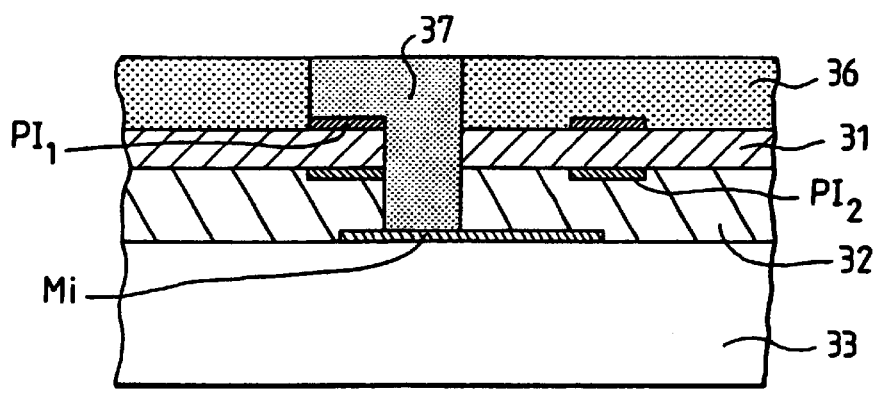
Figure 8D:
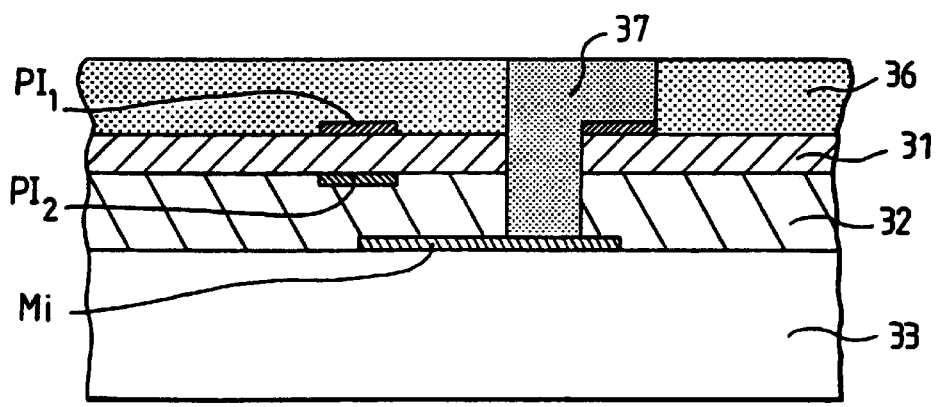

FIGS. 8b, 8c and 8d show respectively the cross sections of FIG. 6a on the planes BB, CC, DD. In this configuration, the dielectric film 31 includes upper metal tracks $PI_1$ and lower metal tracks $PI_2$. The vias are filled in with conductive resin 37; the dielectric film 31 is laminated to the layer of piezoelectric material 33 by means of a layer of adhesive 32. The resin 36, necessary for the process steps, has been retained.

What is claimed is:

1. A process for the fabrication of an acoustic probe including an interconnection circuit and individual transducers produced in a plate of piezoelectric material, said process comprising:

producing a plurality of conducting tracks on at least a first side of a dielectric film;

bonding, after said producing of the plurality of conducting tracks, said first side of said dielectric film having said plurality of conducting tracks to a layer of piezoelectric material using a layer of dielectric adhesive;

producing vias through a second side of said dielectric film, opposite to said first side, and said layer of dielectric adhesive by a localization process to simultaneously produce the vias emerging on at least one of said plurality of conducting tracks and on an associated metallization; and producing electrical contacts between said plurality of conducting tracks and the metallization of said associated piezoelectric material.

2. A process for the fabrication of an acoustic probe according to claim 1, wherein said producing of the plurality of conducting tracks comprises producing said plurality of conducting tracks on said first side of said dielectric film, said layer of adhesive being in contact with said layer of piezoelectric material.

3. A process for the fabrication of an acoustic probe according to claim 1, wherein said producing of the plurality of conducting tracks comprises producing a plurality of conducting tracks on the second side of said dielectric film.

4. A process for the fabrication of an acoustic probe according to claim 3, wherein said process further comprises producing an earth plane on said first side of said dielectric film.

5. A process for the fabrication of an acoustic probe according to claim 1, wherein said step of producing electrical contacts between said plurality of conducting tracks and said metallization are produced by depositing a metal layer followed by local etching of the said metal layer.

6. A process for the fabrication of an acoustic probe according to claim 1, wherein said producing electrical contacts between at least one of said plurality of conducting tracks and said associated metallization are produced by depositing a conductive resin in said vias.

* * * * *